United States Patent [19]

Hwa

[11] 4,041,381
[45] Aug. 9, 1977

[54] METHODS AND EQUIPMENT FOR TESTING REFLECTION POINTS OF TRANSMISSION LINES

[76] Inventor: Lim Ching Hwa, 29 Lorong Batai, Damansara Heights, Kuala Lumpur, Malaysia

[21] Appl. No.: 620,194

[22] Filed: Oct. 6, 1975

[30] Foreign Application Priority Data

Nov. 14, 1974  United Kingdom ............... 49350/74
Oct. 9, 1974   United Kingdom ............... 43699/74

[51] Int. Cl.² .......................................... G01R 31/11
[52] U.S. Cl. ............................... 324/52; 179/175.3 F; 324/58.5 B
[58] Field of Search ............... 324/52, 66, 58 B, 73 R, 324/188, 58.5 B; 179/175.3 F

[56] References Cited

U.S. PATENT DOCUMENTS

| | | | |
|---|---|---|---|
| 3,211,997 | 10/1965 | Hara | 324/52 |
| 3,244,975 | 4/1966 | Bauer | 324/52 |
| 3,255,406 | 6/1966 | Schluter | 324/52 |
| 3,492,464 | 1/1970 | Hill et al. | 324/52 |
| 3,621,387 | 11/1971 | Smith et al. | 324/73 R |
| 3,671,856 | 6/1972 | Shalyt et al. | 324/52 |
| 3,716,783 | 2/1973 | Deering | 324/51 X |
| 3,753,086 | 8/1973 | Shoemaker | 324/52 |
| 3,763,430 | 10/1973 | Terrey | 324/73 R |
| 3,832,900 | 9/1974 | Ross | 324/188 X |
| 3,911,358 | 10/1975 | Shalyt et al. | 324/52 |

Primary Examiner—Gerard R. Strecker
Attorney, Agent, or Firm—Cushman, Darby & Cushman

[57] ABSTRACT

A method of determining a parameter related to reflection in a transmission line said method consisting in repeatedly transmitting into said line a digital word which is a predetermined number of digital bits in length; receiving said words after reflection back from the point of reflection; repeatedly producing similar digital words, each of the aforesaid number of bits in length; delaying said similar words by a series of steps of time delay, each step occurring after a predetermined number of repetitions of said similar words; and utilizing the occurrence of correlation between received reflected words and delayed similar words to determine the said parameter.

13 Claims, 5 Drawing Figures

METHODS AND EQUIPMENT FOR TESTING REFLECTION POINTS OF TRANSMISSION LINES

This invention relates to methods and equipment for testing transmission lines and more specifically to methods and equipment for measuring the distance along a cable (including a co-axial cable), telephone line, power line, or other form of transmission line, of a discontinuity or impedance mismatch capable of reflecting back along the line signals which are fed into it. The main applications of the invention is to the location of transmission line faults which present a reflecting discontinuity or reflecting impedance mismatch and to the measurement of the level of mismatch but obviously the invention may be used to measure a transmission line length by deliberately providing an impedance mismatch at the end of the length to be measured. The invention seeks to provide testing methods of this nature which shall be reliable, applicable to lines of widely different forms, electrical characteristics and lengths, of good accuracy, digital in operation, and which shall be such as to lend themselves to the use of equipments employing integrated circuit of monolithic construction so that the said equipments can be made relatively cheaply and of small physical size and low power consumption.

According to a feature of the invention a method of locating, and/or measuring the distance of a point of reflection in a transmission line and/or of measuring the level or coefficient of reflection at said point said method consisting in repeatedly transmitting into said line a digital word which is a predetermined number of digital bits in length and has the property that the autocorrelation function of the digital words has an impulse function; receiving said words after reflection back from the point of reflection; repeatedly producing similar digital words, each of the aforesaid number of bits in length; delaying said similar words by a series of steps of time delay, each step occurring after a predetermined number of repetitions of said similar words; multiplying the received reflected words by the delayed similar words and integrating the result of multiplication by an integrator; and utilizing the peak value of the output of the integrator to determine the distance along the line of the point of reflection and/or to determine the level or coefficient of reflection at said point.

According to another feature of the invention an equipment for locating and/or measuring the distance of a point of reflection in a transmission line and/or of measuring the level or coefficient of reflection at said point said method consisting in repeatedly transmitting into said line a digital word which is a predetermined number of digital bits in length and has the property that the autocorrelation function of the digital words has an impulse function; receiving said words after reflection back from the point of reflection; repeatedly producing similar digital words, each of the aforesaid number of bits in length; delaying said similar words by a series of steps of time delay, each step occurring after a predetermined number of repetitions of said similar words; multiplying the received reflected words by the delayed similar words and integrating the result of multiplication by an integrator; and utilizing the peak value of the output of the integrator to determine the distance along the line of the point of reflection and/or to determine the level or coefficient of reflection at said point.

The means for producing at said output terminal repeated repetitions of a digital word is preferably a binary chain code generator such as a pseudo random binary sequence (PRBS) or a maximal length (M) sequence generator. Such a generator may be constituted by a shift register having connected across it a feed back path comprising an exclusive-OR gate or a plurality of such gates in cascade, said gate or one or more of said gates (as the case may be) being connected to receive input each from a stage in said shift register.

The means for separating out words reflected back to said output terminal may comprise a differential amplifier having one input supplied from said output terminal and the other supplied with the repeated repetitions of the digital words inverted.

The correlation function between separated words and progressively delayed word repetitions may be determined by a multiplier having one input supplied with the separated reflected back words and the other supplied with the progressively delayed similar words; and an integrator supplied with the output from said multiplier.

The means for utilizing the occurrence of correlation may comprise a display or a recording device. It may be, for example, an oscilloscope or a digital display device or a recorder recording signals on a moving record surface.

The means for producing the progressively step-delayed repeated words may comprise a ring counter, means for supplying periodic pulses thereto, a selector having a plurality of stages each connected to receive the output from a different stage of said counter, and means controlling said selector to select, cyclically and in turn, a different one of the ring counter stages and to pass the selected output to the means for generating said similar words. The said means for supplying periodic pulses may comprise a clock pulse source and a frequency divider, which may be adjustable in ratio, fed from said source.

Where the means for producing repeated repetitions of a digital word include a shift register, the means for controlling said selector may comprise a multi-stage binary counter to which input is supplied from a multiple input AND gate having its multiple inputs supplied each from a different stage in said shift register, said binary counter having a plurality of its end stages connected to control said selector. The binary counter may be adjustable as to the number of its stages in operation at any time.

The invention is illustrated in and further explained in connection with the accompanying drawings in which.

In the following description of the drawings numerical quantities—for example frequencies, division ratios, numbers of stages in certain parts of the equipment—will be mentioned, but it is to be understood that these are by way of practical examples only and in no sense limiting. In FIGS. 2 to 5 inclusive $t$ represents time. In the different parts of each of FIGS. 2 to 5 the time scale is the same, but, as will be apparent later, the time scales in the different figures are different. In the different parts of FIG. 4 the zero voltage axis or line is indicated by 0v. The points in FIG. 1 at which the waveforms in FIGS. 2 to 4 occur are identified by the same bracketed references as are used in the said figures.

Figure 1:
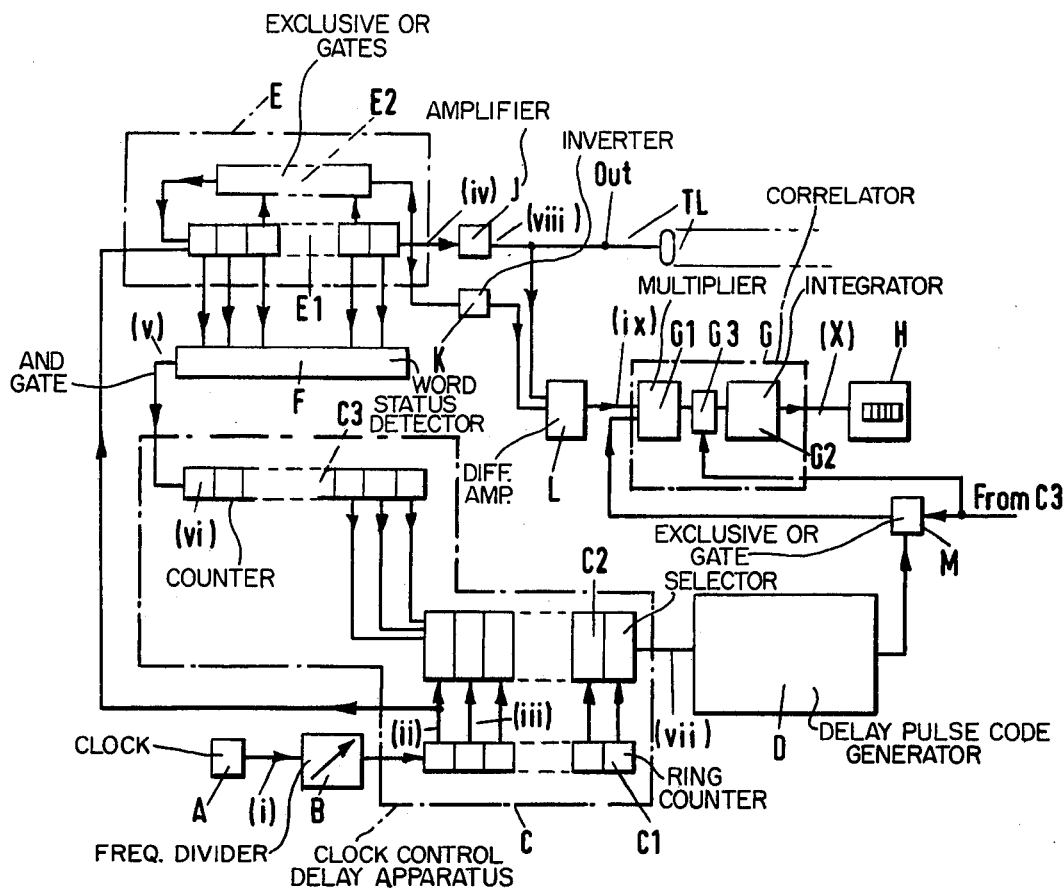
FIG. 1 is a diagrammatic representation of one embodiment of the invention.

Referring to FIG. 1, A is a clock pulse generator, preferably of the piezo-electric crystal type. In practical the frequency of these pulses could be anything desired within a wide range, such as the range of 1 to 100 Mc/s, but it will be assumed that the frequency is 100 Mc/s. These pulses are fed into a variable ratio frequency divider B the ratio of which can be adjusted to any value between, say, 1 and 100. The divided frequency pulses from divider B are represented in the top line ($i$) of FIG. 2 and are fed into the apparatus within the chain line block C of FIG. 1. This apparatus will be herein termed the "clock control dealy apparatus." It comprises a ring counter C1 which, in the present example, is an eight-stage counter the stages of which feed into the respective eight stages of what is herein termed a "1 out of $n$ selector" C2, which is in turn controlled by a binary counter C3. This counter is, in the present example, a 13-stage counter of which the last three stages actually control the selection by the selection C2. The selection C2 is, in effect, a scanning device scanning across the eight outputs from the ring counter C1 selecting them in turn under the control of the last three stages of the binary counter C3, for passage to what is herein termed the "delay pulse code generator" D. this is similar to what is herein termed the "reference pulse code generator" E which will be described later. The full action of the binary counter C3 will be described later; for the moment it is sufficient to state, as indeed fairly obvious, that since its last three stages effect control of the selection by the selector C2, it can in turn select the $2^3 = 8$ inputs from C1 to C2.

Figure 2:
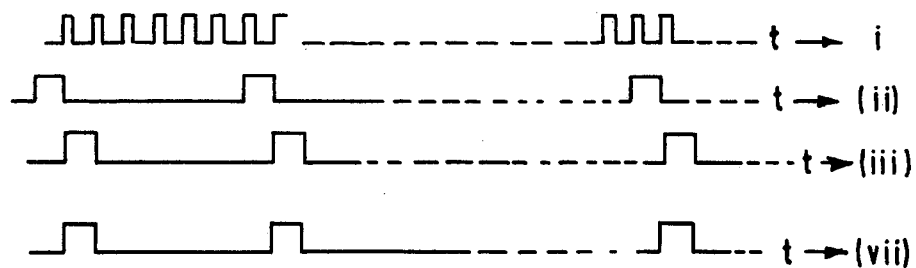
FIGS. 2 to 5 are explanatory graphical figures, FIGS. 2, 3 and 4 showing typical waveforms at various points in the fault locating and measuring equipment of FIG. 1, and FIG. 5 being a representation of the way in which the location of a fault could be displayed.
Figure 3:
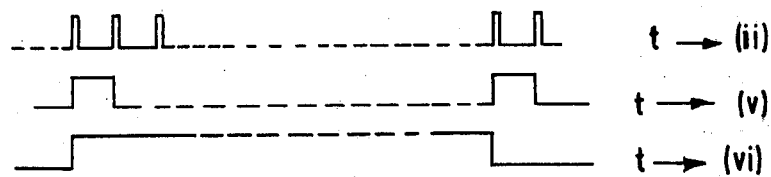
Figure 4:
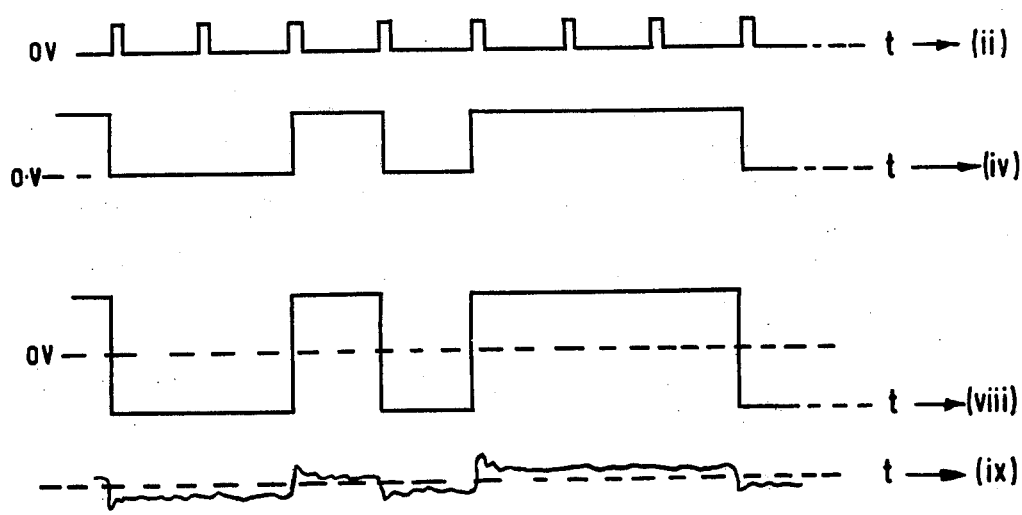

The output of the first stage of the ring counter C1 is represented by the second line ($ii$) of FIG. 2 and also by the top line ($ii$) of FIG. 3 and also by the top line ($ii$) of FIG. 4. This output is used as the clock timing pulse input for the reference pulse code generator E to be described below. A similar output, delayed however by one pulse width of the ouput from the first stage of said ring counter, appears from the second stage of said counter, as shown by line ($iii$) of FIG. 2. Similar outputs appear from the remaining stages of the ring counter C1 each, however, being delayed by one pulse width with respect to that from the preceding stage. It is these differently delayed outputs which are selected in turn by the selector C2 and passed on to the delay pulse code generator D.

The reference pulse code generator E produces repeatedly a train of pulses of varying width, though each train (or so-called "word") is the same overall length, i.e., comprises the same number of bits. There is a wide choice of design for this generator. In the present example it comprises an eight-stage shift register E1 across which is connected a feed back path E2 comprising, for example, a plurality of exclusive-OR gates in cascade, one or more of which receive inputs from different stages of the shift register E1. The number and connection of the gate in the feedback path E2 are chosen, in accordance with well-known principles, to determine the PRBS output from the generator E to be as desired. A typical output is shown in line ($iv$) of FIG. 4.

The outputs from the different stages of the shift register provide the inputs to what is herein termed a "word status detector" F. In the present example it is constituted by a multiple input AND gate. The output from F is represented in the second line ($v$) of FIG. 3. As will be seen there will be, in the present case, one pulse output from F for every 255 pulses from the first stage of C1 ($255 = 2^8 - 1$, since, obviously, there will be no output from E2 if all the stages of E1 are at 0 in digital terminology and this state of E1 is not permitted). The output from F is fed into the 13 stage binary counter C3 the last three stages of which control the selection by the selector C2. The output from the first stage of the binary counter C3 is shown in the last line ($vi$) of FIG. 3 while that from the selector C2 is as shown by the last line ($vii$) of FIG. 2. This output from C2 is fed into the delay pulse code generator D which, as already stated, is similar to the reference pulse code generator E, and the output from which constitutes one input to a multiplier G1 constituted by an analogue gate and forming part of a correlator G.

The correlator G comprises the aforesaid multiplier G1 and a resettable integrator G2 into which the output from said multiplier is fed and the output from which actuates a suitable display or recording device H which may take any of a variety of suitable forms, It may, for example, be an oscilloscope or a digital display device or a recording instrument recording on a moving paper record surface. The display device is represented purely diagrammatically in FIG. 1 with only a single connection thereto—that from the integrator G2. Of course in practice certain forms of indicator, e.g., a digital indicator, would require more than this one connection to operate but since the indicator forms per se no part of the invention it is not thought necessary further to describe or illustrate the various forms of indicator which could be used or their circuitry.

Automatic cancellation of drifts and offsets may be achieved by providing, as shown in FIG. 1, an exclusive OR gate M and an electronic change-over switch G3 in the case where multiplier G1 has differential outputs and integrator G2 has differential inputs. When exclusive OR gate is driven by a square wave, for example from one stage of the counter C3, which also drives the change-over switch G3, the desired signals presented to integrator G2 are unchanged while drifts and offsets are presented in opposite polarities to integrator G2 resulting in their cancellation.

Referring again to the reference pulse code generator E, the output from this, represented at ($iv$) of FIG. 4, is passed through a buffer amplifier J to the output terminal OUT of the fault locating and measuring equipment shown in FIG. 1. The transmission line a fault in which is to be located by the equipment, is connected to this terminal. The transmission line may be of any of a wide variety of forms—for example a co-axial or other cable, a two-wire line or a telephone line—and the equipment will locate the position of a fault therein capable of reflecting back the PRBS fed into the line and allow measurement of the reflection coefficient. Such a reflecting fault may be a discontinuity or anything producing an impedance mismatch. The waveform fed into the transmission line from the buffer amplifier J is represented by the third line ($viii$) of FIG. 4 which, as will be seen, is like the input (($iv$) of FIG. 4) to the amplifier J except that it is symmetrical with respect to the zero voltage line 0v. The output from the generator E is also fed via an inverter K to one input of a differential amplifier L which feeds into the remaining input of the multiplier G1 and the other input to which is constituted by the signal mixture (transmitted signals and reflected signals) present at the output terminal OUT when a transmission line with a reflecting fault in it is connected to that terminal. The supply of waveform (*viii*) to one input of the differential amplifier L and the same waveform, inverted, to the other input of the said amplifier separates out the reflected signals i.e. causes the output of the differential amplifier to be due to the reflected signal coming back to OUT from the fault. The output from the differential amplifier is typified in the bottom line (*ix*) of FIG. 4 and constitutes the remaining input to the multiplier G1. The said output (*ix*) is, in general, an irregular waveform but its characteristics and important feature is that it has the pronounced pulses related in time, as shown to the waveform (*viii*) of FIG. 4, being a delayed, distorted and attenuated version of said waveform (*viii*).

Figure 5:
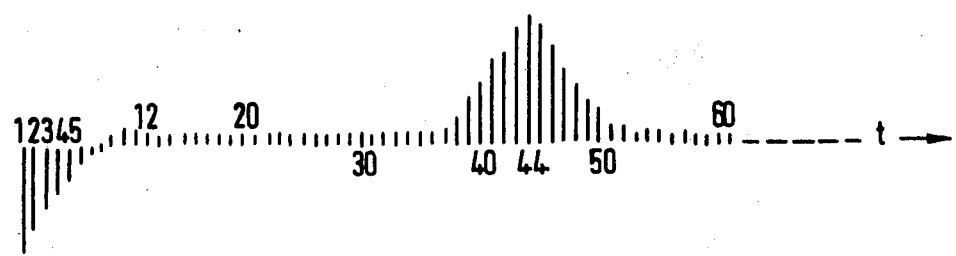

Briefly describing and in part recapitulating the operation of the equipment it will be seen that the reference pulse code generator E repeatedly produces and feeds into the line TL a word which, in the particular example illustrated and described, occupies $2^8 - 1 = 255$ bits. The output from the word status detector F is fed into the binary counter C3. In practice the number of stages in this counter may be adjustable but, for the purposes of the present description, it will be assumed that it has, as previously stated, 13 stages of which the last three control the scanning or selecting action of the selection C2. The result is to produce, as the output from the delay pulse code generator D the word repeated 1024 times (due to the first 10 stages of the binary counter C3: $2^{10} = 1024$); followed by the same word repeated 1024 times but delayed by one step of delay; followed by the same word repeated 1024 times but delayed by a further step of delay; . . . and so on, each succeeding set of 1024 repetitions being delayed by an additional step until the last set of repetitions is delayed by eight steps after which the cycle is repeated for selector C2, the steps of delay continuing for each succeeding 1024 word repetitions. Each step of delay is equal to one period of the divided clock waveform (*ii*) of FIG. 2. By multiplying, in multiplier G1, the outputs from the differential amplifier L and from the generator D, and integrating the resultant there is obtained an integrated output which may be conventionally represented as shown in FIG. 5 and which consists of a series of equally spaced "pips", each of which represents the integrator output corresponding to one step of delay of the delay pulse code generator. These pips are numbered consecutively in FIG. 5. A "pip" appears at every 1024the pulseof waveform (*v*) of FIG. 3 and corresponds to one step of delay. The steps of delay correspond with a particular length of transmission line. FIG. 5 is drawn for the case in which there is a fault or mismatch at the 44th pip and this, of course, defines with good precision the location of the fault in the line. For example, if each step of delay has been set for 5 meters, the fault or mismatch in FIG. 5 would be $44 \times 4 = 220$ meters along the line from the output terminal of the equipment. FIG. 5 is a representation of the signal appearing at the output of the integrator G2 ((*x*) in FIG. 1): if the display device is an oscilloscope FIG. 5 might be taken as a representation of the display produced thereon. Thus the oscilloscope may be caused to indicate distance along the line directly by counting the number of "pips" before the peak amplitude of the "pips" occurs. Such counting could obviously be done automatically by a counter controlled by a peak detector detecting the "pip" peak amplitude. This direct indication of distance may, of course, be obtained whatever type of display device is used. In addition, the peak value of the group of "pips" representing the correlation function is a measure of the coefficient of reflection while the envelope shape of the group of "pips" gives an indication of the type of mismatch, e.g., whether it is of low or high impedance or is a capacitive mismatch.

If the counter C3 is operated in the up-counting mode, the first output pulse from selector C2 immediately following the selection of a new input to it is inhibited. If, however, the said counter C3 is operated in the down-counting mode no such inhibit is required but the delay pulse code generator D now becomes an advance pulse code generator D. Accordingly, in this case, the output of the (now) advance code generator and that of the reference pulse code generator E should be interchanged in the circuit of FIG. 1, i.e., in FIG. 1 the output of D should be fed to J and K and the output of E should be fed to the exclusive-OR gate M.

The divided clock frequency used (waveform (*ii*) of FIG. 2) determines the range (maximum length of transmission line in which a fault can be located) and resolution, the higher the divided clock frequency the greater the resolution for a given range. Making the divider B of adjustable ratio and the binary counter C3 of an adjustable number of stages enables one and the same equipment to be used to test a wide variety of different lines. Of course, where such adjustability is provided, corresponding adjustment provision should be made with regard to the display device to ensure that its scale reading (for example in length of transmission line) will be correct and suited to the other adjustments made.

The invention has many important practical advantages. It provides a fault locating and measuring equipment which is reliable in action, is to a high degree immune from error (because of the use of a continuous digital test signal and the integration performed in the correlator G), is capable of giving high resolution and therefore good accuracy of fault location and measurement over long lengths of transmission line, and is readily applicable to fault location and measurement in widely different forms of transmission line. Moreover it is digital in operation and the equipment can be manufactured comparatively cheaply and be made remarkably small and compact, for its lends itself admirably to integrated circuit construction or monolithic construction with many if not all of the circuitry (apart, possibly from the display device itself) on a single "chip." In addition the power consumption may be made relatively very small indeed if integrated circuit or monolithic construction is employed.

The invention is, of course, not limited to the particular circuitry illustrated in and described with reference to FIG. 1 and other circuit arrangements capable of performing the same functions and known per se may be used.

It will be apparent that the illustrated embodiment can be used to determine the distance along a transmission line of a discontinuity or impedance mismatch providing a point of reflection or for determining the coefficient of reflection at that point whether the said point of reflection occurs accidentally, as in the case of a transmission line fault, or whether it is deliberately produced, as would be the case when a discontinuity or impedance mismatch is purposely introduced into the line at some point in order to measure the length of line up to that point.

I claim:

1. A method of locating and/or measuring the distance of a point of reflection in a transmission line and- /or of measuring the level of coefficient of reflection at said point, said method comprising the steps of:

repeatedly transmitting into said line a digital word which is a predetermined number of digital bits in length, and has the property that the autocorrelation function of the digital words has an impuse function;

receiving said words after reflection back from a point of reflection;

repeatedly producing similar digital words, each word having the aforesaid number of bits in length;

delaying said similar words by a series of steps of time delay, each step occurring after a predetermined number of repetitions of said similar words;

multiplying the received reflected words by the delayed similar words;

integrating the result of multiplication by an integrator; and utilizing the peak value of the output of the integrator to determine the distance along the line of the point of reflection and/or to determine the level or coefficient of reflection at said point.

2. An equipment for locating and/or measuring the distance of a point of reflection in a transmission line and/or measuring the level or coefficient of reflection at said point, said equipment comprising:

means for producing, at an output terminal for connection to a line to be tested, repetitions of a digital word which is a predetermined number of digital bits in length and for progressively delaying the repetitions of said words in steps each of which occurs after a predetermined number of repetitions and corresponds with a length of line to be tested;

means for effecting multiplication of separated reflected words by the progressively step delayed word repetitions;

means for integrating the results of multiplication produced during each step of delay of the progressively step delayed word repetitions to produce a series of output values from said integrating means; and means for utilizing the peak value of said series of values to indicate the location or distance of the point of reflection in a transmission line connected to said output terminal and/or the level or coefficient of reflection at said point by noting the number of steps of progressive delay at which said peak value occurs to determine the location or distance of said point and/or by noting the amplitude of said peak value relative to that of the repetition of the digital word produced at said output terminal to determine the level or coefficient of reflection at said point.

3. An equipment as claimed in claim 2 wherein the means for producing at said output terminal repeated repetitions of a digital word is a binary chain code generator.

4. An equipment as claimed in claim 3 wherein the binary chain code generator comprises a shift register and a feedback path connected across said shift register, comprising at least one exclusive OR-gate, said gate being connected to receive an input each from a stage in said shift register.

5. An equipment as claimed in claim 2 wherein words reflected back to said output terminal are separated out be means including an inverter means for inverting said repeated repetitions of said words, and a differential amplifier having one input supplied from said output terminal and the other supplied with the inverted repeated repetitions of the digital words.

6. An equipment as claimed in claim 2 wherein the correlation function between separated reflected words and progressively delayed word repetitions is determined by a multiplier having one input supplied with the separated reflected words and the other supplied with the progressively delayed word repetitions; and an integrator supplied with the output from said multiplier.

7. An equipment as claimed in claim 2 wherein said utilization means include a display or recording device.

8. An equipment as claimed in claim 2 wherein the means for producing the progressively step-delayed word repetitions comprise:

a ring counter, means for supplying periodic pulses thereto, a selector having a plurality of stages each connected to receive the output from a different stage of said counter, and means controlling said selector to select, cyclically and in turn, a different one of the ring counter stages and to pass the selected output to the means for generating said similar words.

9. An equipment as claimed in claim 8 wherein the said means for supplying periodic pulses comprise a clock pulse source and a frequency divider fed from said source.

10. An equipment as claimed in claim 8 wherein the frequency divider is of adjustable ratio.

11. An equipment as claimed in claim 2 wherein the means for producing the repetitions of the digital word include a shift register and wherein there is provided a selector controlled by a multi-stage binary counter to which input is supplied from a multiple input AND gate having its multiple inputs supplied each from a different stage in said shift register, said binary counter having a plurality of its end stages connected to control said selector.

12. An equipment as claimed in claim 11 wherein the binary counter is adjustable as to the number of its stages in operation at any time.

13. An equipment as claimed in claim 2 further comprising means, including an exclusive OR gate and change over switch means for automatically cancelling drifts and offsets, said exclusive OR gate being driven by a wave which also drives the change over switch.

* * * * *